(12) United States Patent
Yamanaka et al.

(10) Patent No.: US 11,653,547 B2
(45) Date of Patent: May 16, 2023

(54) DISPLAY DEVICE

(71) Applicant: SHARP KABUSHIKI KAISHA, Sakai (JP)

(72) Inventors: Masaki Yamanaka, Sakai (JP); Yohsuke Kanzaki, Sakai (JP); Yi Sun, Sakai (JP); Takao Saitoh, Sakai (JP); Masahiko Miwa, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 162 days.

(21) Appl. No.: 17/255,867

(22) PCT Filed: Jul. 12, 2018

(86) PCT No.: PCT/JP2018/026378
§ 371 (c)(1),
(2) Date: Dec. 23, 2020

(87) PCT Pub. No.: WO2020/012611
PCT Pub. Date: Jan. 16, 2020

(65) Prior Publication Data
US 2021/0265429 A1    Aug. 26, 2021

(51) Int. Cl.
*H01L 27/32* (2006.01)
*G06F 3/041* (2006.01)
*G06F 3/044* (2006.01)

(52) U.S. Cl.
CPC .......... *H10K 59/40* (2023.02); *G06F 3/0412* (2013.01); *G06F 3/0443* (2019.05);
(Continued)

(58) Field of Classification Search
CPC ........ H05B 33/02; H05B 33/22; H05B 33/12; H05B 33/04; H05B 33/06; G06F 3/0412;
(Continued)

(56) References Cited

U.S. PATENT DOCUMENTS

| | | |
|---|---|---|
| 2005/0258441 A1 | 11/2005 | Shitagami |
| 2018/0061899 A1* | 3/2018 | Oh .................. H01L 51/5253 |

(Continued)

FOREIGN PATENT DOCUMENTS

| | | |
|---|---|---|
| JP | 2006004907 A | 1/2006 |
| WO | 2018/138811 A1 | 8/2018 |

*Primary Examiner* — Deeprose Subedi
(74) *Attorney, Agent, or Firm* — ScienBiziP, P.C.

(57) ABSTRACT

A display device includes a display layer that includes a TFT layer, a light-emitting element layer, a sealing layer, a bank, and a touch panel layer. The touch panel layer includes a plurality of touch-panel-use lines electrically connecting a terminal section to a plurality of sensing sections configured to transfer measurements. The plurality of touch-panel-use lines resides on the sealing layer so as to intersect with the bank in a plan view of the display device. The plurality of touch-panel-use lines comprises a first touch-panel-use line and a second touch-panel-use line that are adjacent to each other, an interlayer insulation film being interposed between the first touch-panel-use line and the second touch-panel-use line in an intersection where the first touch-panel-use line and the second touch-panel-use line intersect with the bank.

10 Claims, 9 Drawing Sheets

(52) U.S. Cl.
CPC .. *H10K 59/131* (2023.02); *G06F 2203/04112* (2013.01); *H10K 50/844* (2023.02)

(58) Field of Classification Search
CPC .. G06F 3/04164; G06F 3/0446; G06F 3/0443; G06F 2203/04112; G09F 9/30; G09F 9/00; H01L 27/323; H01L 51/5253; H01L 2251/5392

See application file for complete search history.

(56) References Cited

U.S. PATENT DOCUMENTS

2019/0361550 A1   11/2019  Sonoda et al.
2021/0005678 A1*  1/2021  Lee ..................... G06F 3/0443

* cited by examiner

DISPLAY DEVICE

TECHNICAL FIELD

The disclosure relates to display devices.

BACKGROUND ART

Self-luminous OLED display devices, built around OLEDs, have been attracting attention as a promising successor to the liquid crystal display device. Some OLED display devices include touch panels (see, for example, Patent Literature 1 introduced below). Specifically, the conventional OLED display device includes: a touch panel main body (touch panel function layer) on a display area; and touch-panel-use lines connected to the touch panel main body, routed from the display area to a terminal section, and connected to a detection circuit via the terminal section in such a manner as to detect operations performed on the touch panel by the user.

CITATION LIST

Patent Literature

Patent Literature 1: Japanese Unexamined Patent Application Publication, Tokukai, No. 2006-4907 (Publication Date: Jan. 5, 2006)

SUMMARY

Technical Problem

The conventional OLED display device further includes a sealing layer for sealing a light-emitting element layer (organic light-emitting layer) on a substrate to prevent degradation of the light-emitting element layer. The sealing layer is, for example, an organic insulation film provided by inkjet coating. The conventional OLED display device further includes a frame-shaped bank (damming wall) surrounding the display area, so that the bank can define an edge of the organic insulation film.

When the touch panel has an on-cell structure, where the touch panel is provided on the sealing layer, to reduce the thickness of the conventional OLED display device, the touch-panel-use lines cross over the bank. This structure could undesirably lead to short-circuiting of adjacent touch-panel-use lines in the intersections.

The disclosure, in view of the problem, has an object to provide a display device, including an on-cell touch panel, that allows no short-circuiting of adjacent touch-panel-use lines.

Solution to Problem

To address the problem, the disclosure, in an aspect thereof, is directed to a display device having: a display area; a non-display area around the display area; and a terminal section in the non-display area, the display device including: a display layer including: a TFT layer, a light-emitting element layer controlled by the TFT layer; a sealing layer on the light-emitting element layer, the sealing layer including a first inorganic insulation film, an organic insulation film, and a second inorganic insulation film that are arranged in this order when viewed from the light-emitting element layer, and a bank around the display area, the bank defining an edge of the organic insulation film; and a touch panel layer, wherein the touch panel layer includes a plurality of touch-panel-use lines electrically connecting the terminal section to a plurality of sensing sections configured to transfer measurements, the plurality of touch-panel-use lines resides on the sealing layer so as to intersect with the bank in a plan view of the display device, and the plurality of touch-panel-use lines includes a first touch-panel-use line and a second touch-panel-use line that are adjacent to each other, an interlayer insulation film being interposed between the first touch-panel-use line and the second touch-panel-use line in an intersection where the first touch-panel-use line and the second touch-panel-use line intersect with the bank.

Advantageous Effects of Disclosure

The disclosure, in an aspect thereof, allows no short-circuiting of adjacent touch-panel-use lines when the touch panel has an on-cell structure.

Figure 5:
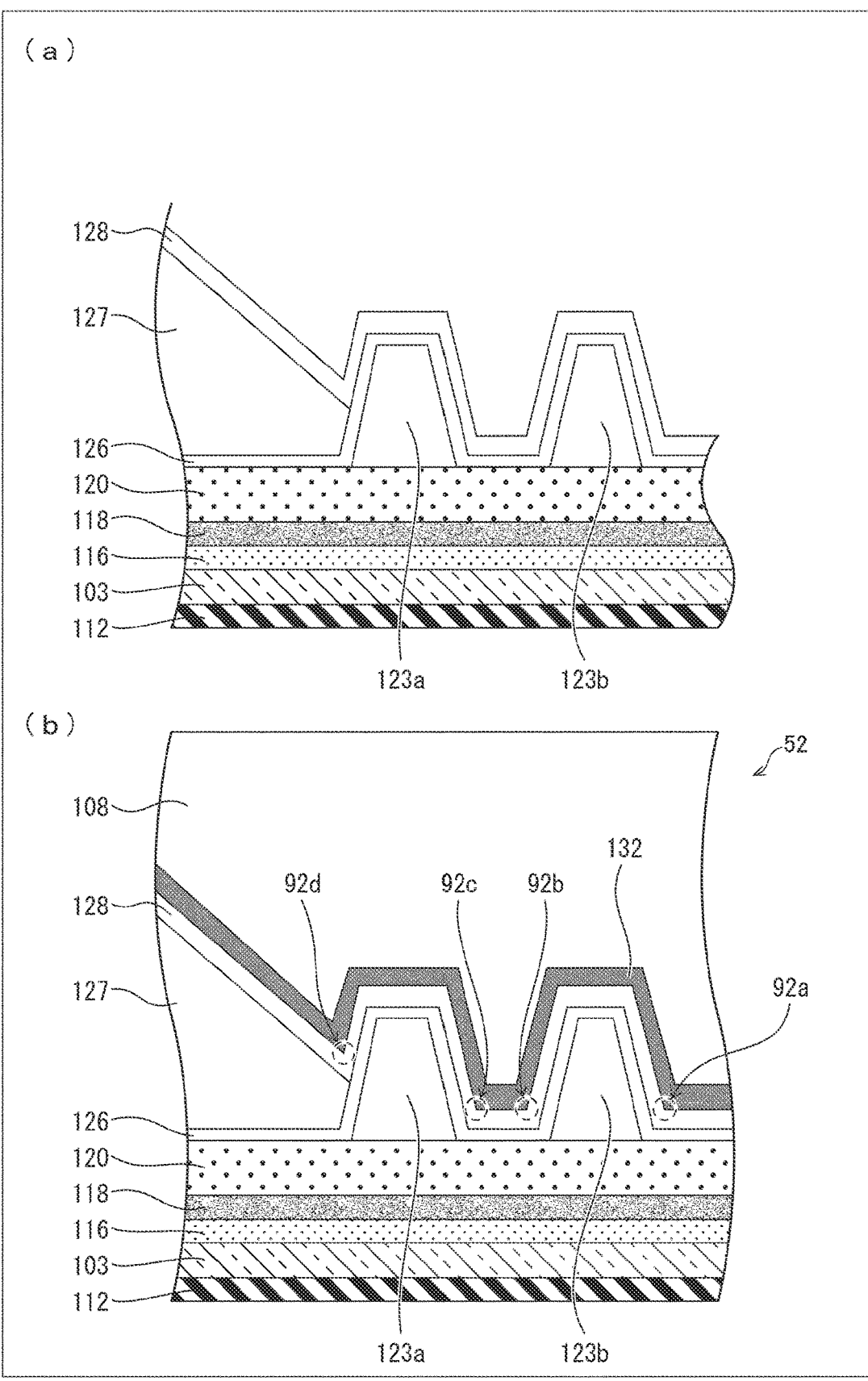

Portions (a) and (b) of FIG. 5 are partial cross-sectional views showing manufacturing steps for a display device in accordance with a comparative example, illustrating problems of the display device.

Figure 6:
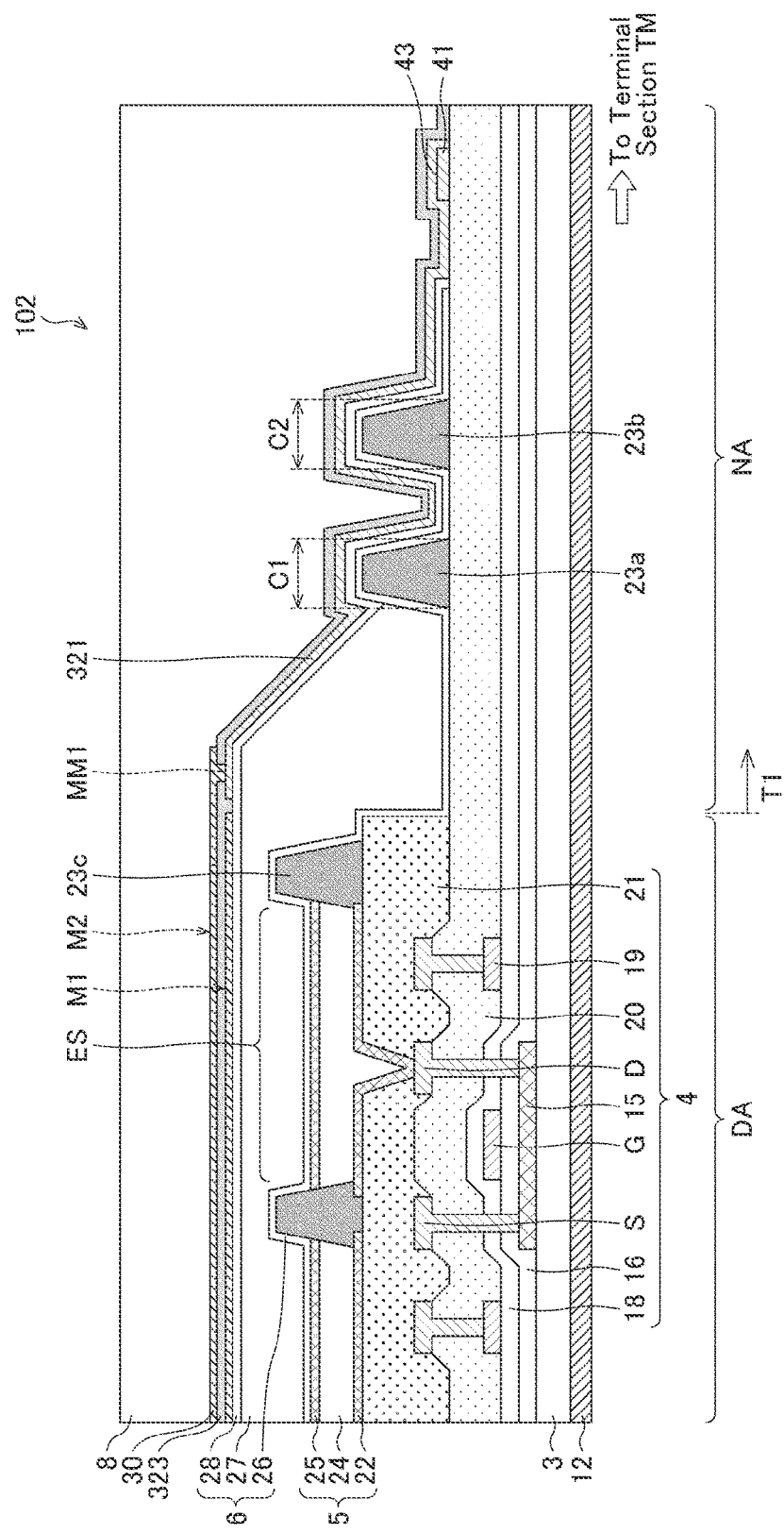

FIG. 6 is a partial cross-sectional view of a display device in accordance with Embodiment 2 of the disclosure, primarily showing a first touch-panel-use line.

Figure 7:
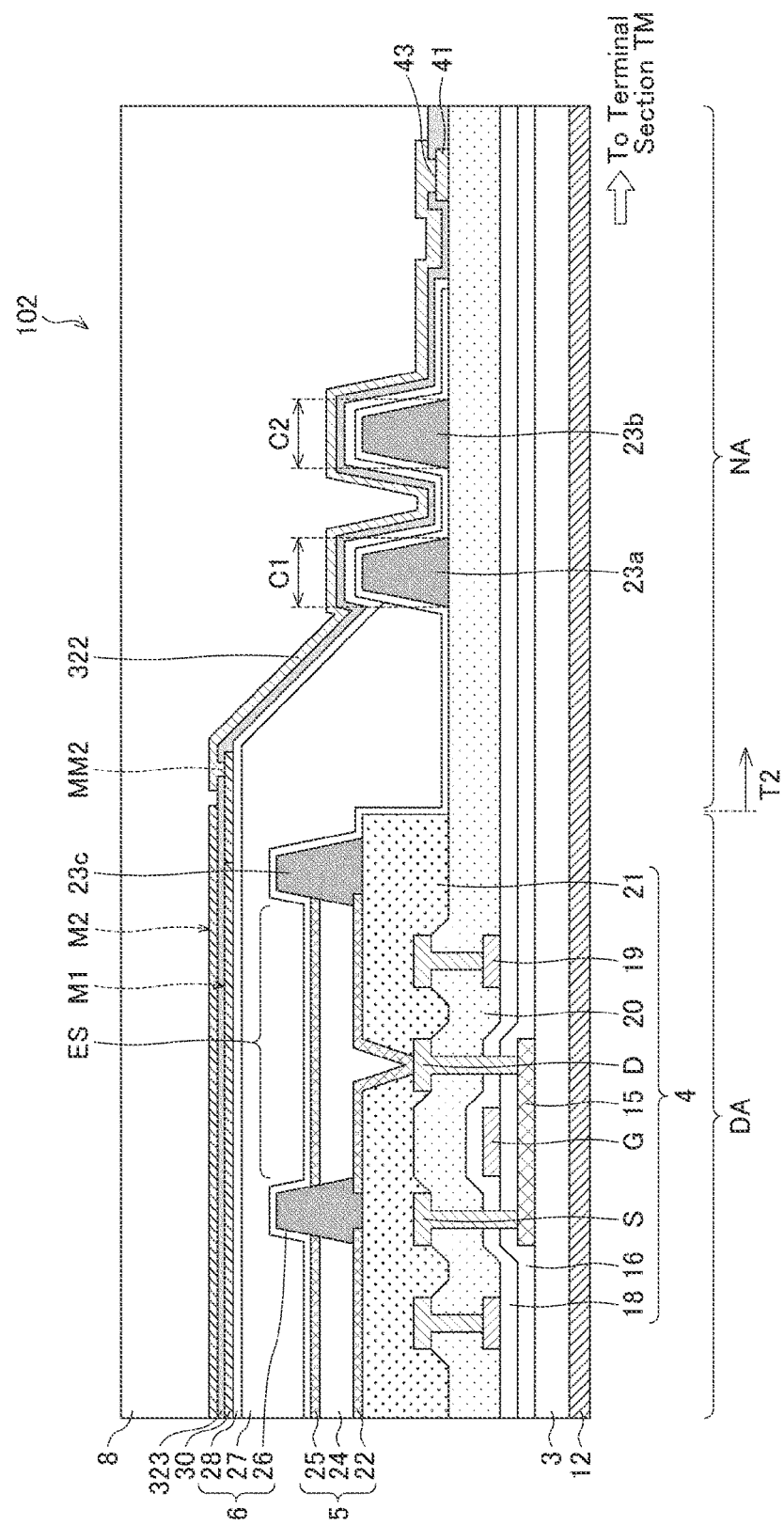

FIG. 7 is another partial cross-sectional view of the display device in accordance with Embodiment 2 of the disclosure, primarily showing a second touch-panel-use line.

Figure 8:
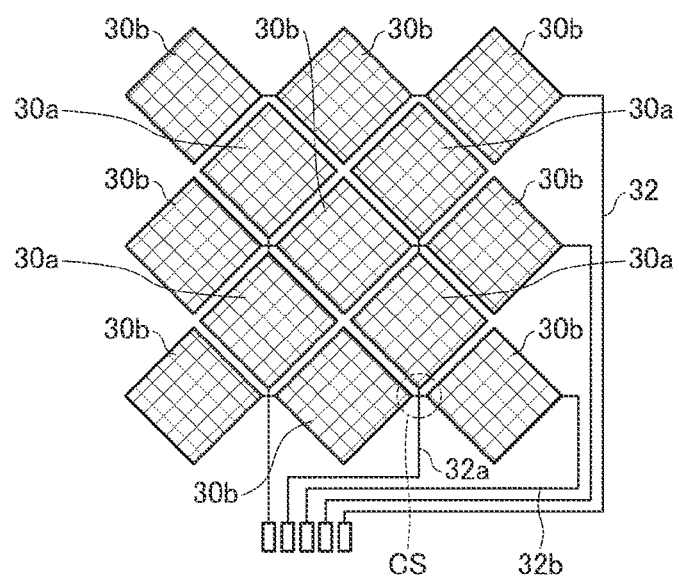

FIG. 8 is a schematic plan view of wiring in a touch panel layer in accordance with Embodiment 2 of the disclosure.

Figure 9:
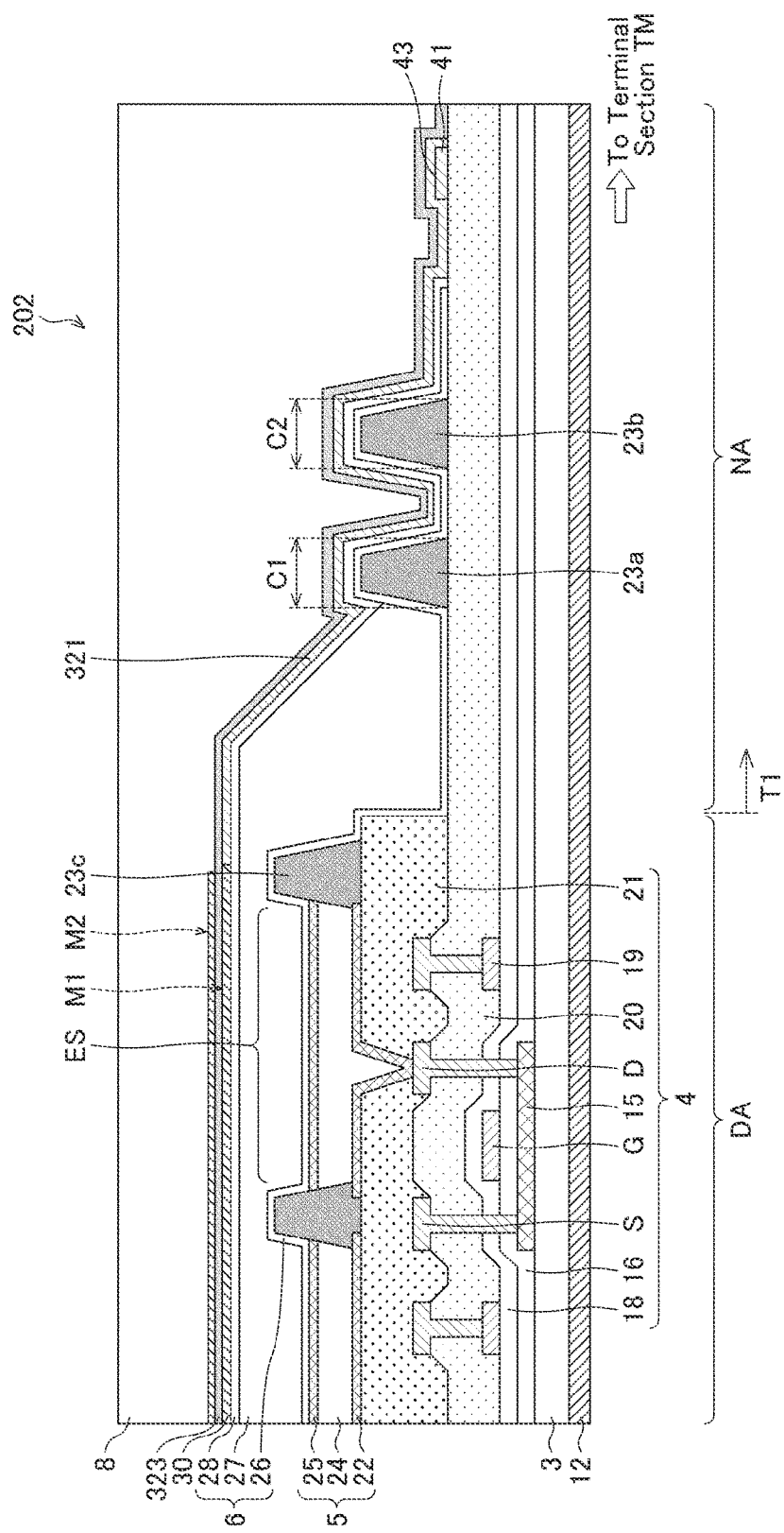

FIG. 9 is a partial cross-sectional view of a display device in accordance with a variation example of Embodiment 2 of the disclosure, primarily showing a first touch-panel-use line.

Figure 10:
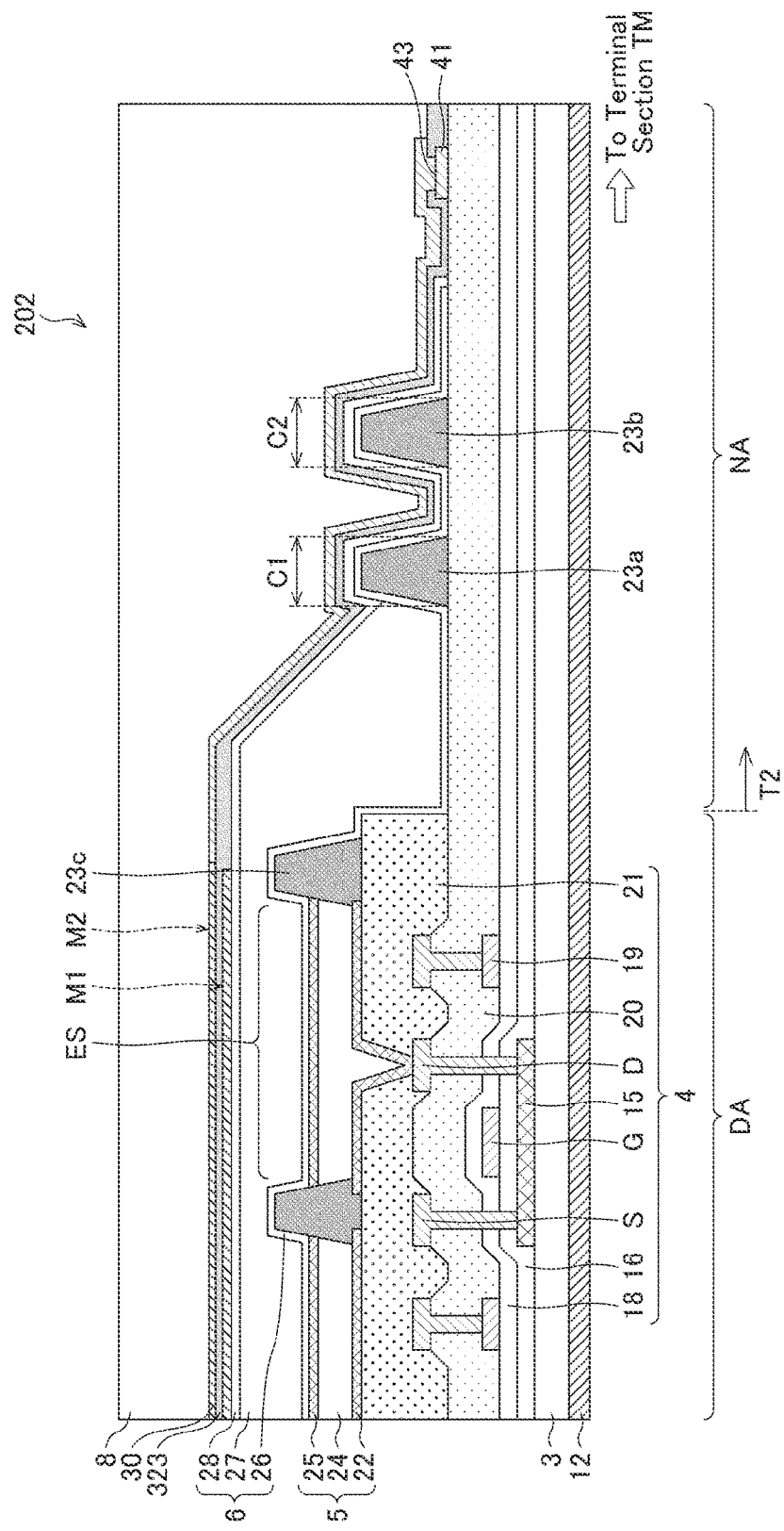

FIG. 10 is another partial cross-sectional view of the display device in accordance with the variation example of Embodiment 2 of the disclosure, primarily showing a second touch-panel-use line.

DESCRIPTION OF EMBODIMENTS

The following will describe embodiments of the disclosure. For convenience of description, those members which have the same function as previously described members will be indicated by the same reference numerals, and description thereof may be omitted. Some members that are barely related to the features of the disclosure may be only schematically shown or totally omitted in the drawings, to show the features as prominently as possible.

Embodiment 1

Figure 1:
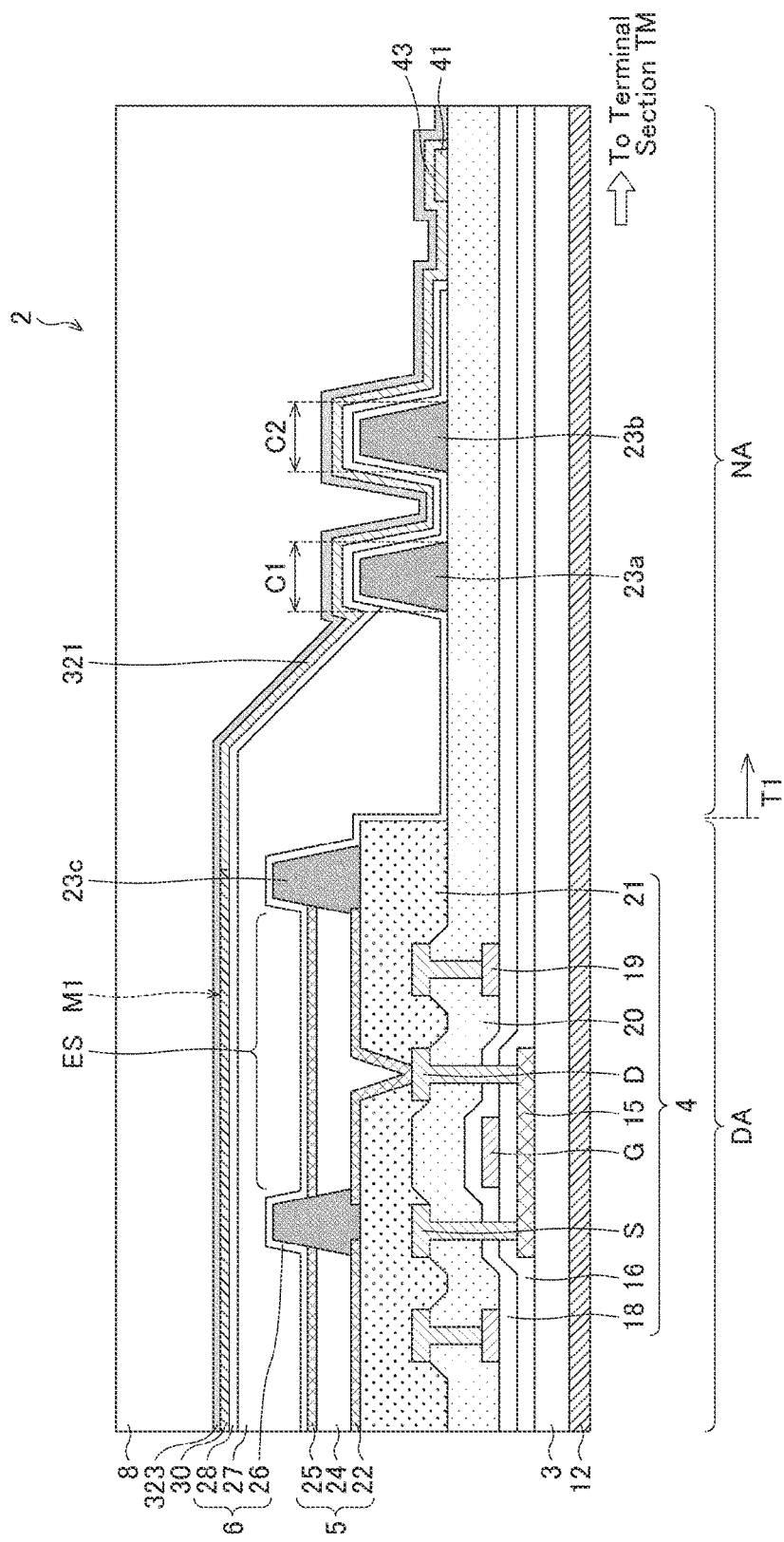
FIG. 1 is a partial cross-sectional view of a display device in accordance with Embodiment 1 of the disclosure, primarily showing a first touch-panel-use line.
Figure 2:
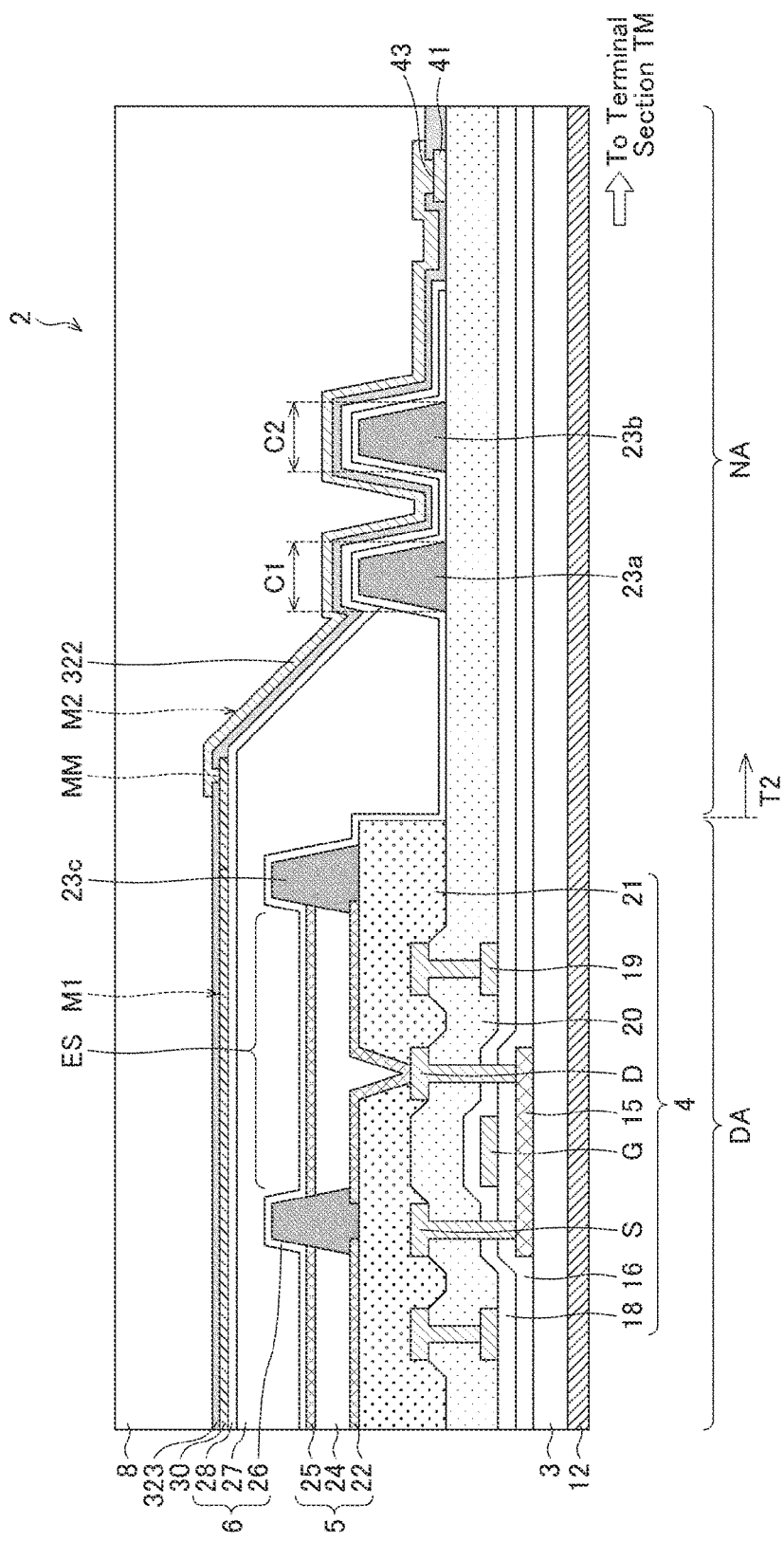
FIG. 2 is another partial cross-sectional view of the display device in accordance with Embodiment 1 of the disclosure, primarily showing a second touch-panel-use line.
Figure 3:
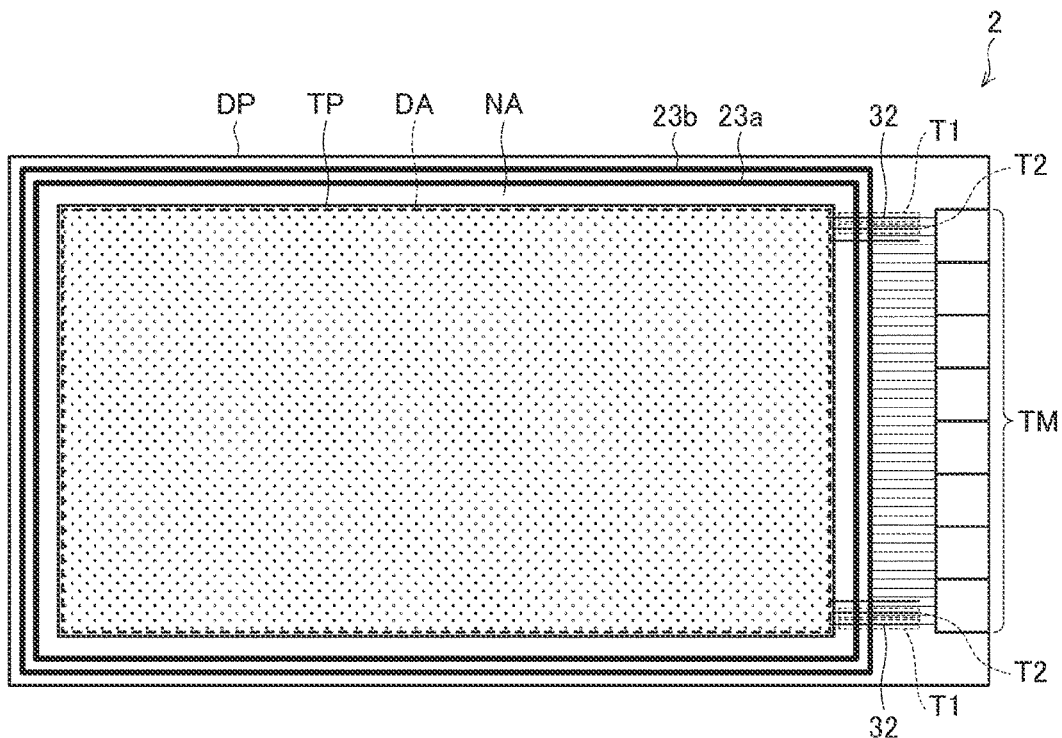
FIG. 3 is a schematic plan view of a structure of the display device in accordance with Embodiment 1 of the disclosure.

FIG. 1 is a partial cross-sectional view of a display device 2 in accordance with Embodiment 1 of the disclosure, primarily showing a first touch-panel-use line 321. FIG. 2 is another partial cross-sectional view of the display device 2 in accordance with Embodiment 1 of the disclosure, primarily showing a second touch-panel-use line 322. FIG. 3 is a schematic plan view of a structure of the display device 2 in accordance with Embodiment 1 of the disclosure. The regions denoted by T1 and T2 in FIGS. 1 and 2 respectively correspond to the regions denoted by T1 and T2 in FIG. 3.

Referring to FIG. 3, the display device 2 includes a display layer DP and a touch panel layer TP. The display layer DP has a display area DA, a non-display area NA, a terminal section TM, and first and second banks 23a and 23b. The touch panel layer TP contains touch-panel-use lines 32.

The display area DA is an area where there is provided a plurality of subpixels to produce a display. The non-display area NA is an area, surrounding the display area DA, where there is produced no display. The non-display area NA is alternatively referred to as the frame area. The terminal section TM is provided in the non-display area NA and contains a plurality of terminals. Both the first bank 23a and the second bank 23b are provided in the non-display area NA in such a manner as to surround the display area DA. The first bank 23a is located closer to the display area DA than is the second bank 23b. The second bank 23b is located farther from the display area DA than is the first bank 23a (in other words, the second bank 23b is located surrounding the first bank 23a.

The touch panel layer TP is an "on-cell" touch panel provided on the display area DA. The touch-panel-use lines 32 electrically connect, to the terminal section TM, corresponding wires among sensing sections (detailed later) that transfer measurements from the touch panel layer TP. There are provided more than one touch-panel-use line 32. The touch-panel-use lines 32 are provided so as to cross over the first bank 23a and the second bank 23b in a plan view of the display device 2.

FIG. 3 shows, for convenience of description, a total of only six touch-panel-use lines 32, three connected to an upper end of the terminal section TM and another three connected to a lower end thereof. The number of the touch-panel-use lines 32 is not limited in any particular manner. The touch-panel-use lines 32 may be provided near the midportion of the terminal section TM in the figure.

The following will further describe the display device 2 with reference to FIGS. 1 and 2. The touch panel layer TP (see FIG. 3) includes sensing sections 30, the first touch-panel-use line 321, the second touch-panel-use line 322, and an interlayer insulation film 323. The display layer DP (see FIG. 3) includes all other layers located below these layers.

A resin layer 12 is made of, for example, a polyimide. The resin layer 12 may be replaced by two resin films (e.g., polyimide films) and an inorganic insulation film interposed between these two resin films.

A base coat film 3 prevents foreign materials such as water and oxygen from seeping into a TFT layer 4 and a light-emitting element layer 5. The base coat film 3 may include, for example, a silicon oxide film, a silicon nitride film, a silicon oxynitride film, or a stack of these films. The films can be formed by CVD.

The TFT layer 4 includes a semiconductor film 15, an inorganic insulation film 16 (gate insulation film) overlying the semiconductor film 15, a gate electrode G and a gate line overlying the inorganic insulation film 16, an inorganic insulation film 18 overlying the gate electrode G and the gate line, a line 19 overlying the inorganic insulation film 18, an inorganic insulation film 20 overlying the line 19, a source electrode S, a source line, a drain electrode D, a drain line overlying the inorganic insulation film 20, and a planarization film 21 overlying the source electrode S and the source line.

The semiconductor film 15 is made of, for example, a low-temperature polysilicon (LTPS) or an oxide semiconductor (e.g., In—Ga—Zn—O-based semiconductor). A transistor (TFT) is structured so as to include the semiconductor film 15 and the gate electrode G. FIGS. 1 and 2 show a transistor with a top-gate structure. The transistor may alternatively have a bottom-gate structure.

The gate electrode G, the gate line, the line 19, the source electrode S, and the source line are made of, for example, a monolayer film of at least one of metals of aluminum, tungsten, molybdenum, tantalum, chromium, titanium, and copper or a stack of these films. The TFT layer 4 includes a single semiconductor layer and three metal layers.

The inorganic insulation films 16, 18, and 20 may be made of, for example, a silicon oxide (SiOx) film or a silicon nitride (SiNx) film formed by, for example, CVD or a stack of these films. The planarization film 21 may be made of, for example, an organic material, such as polyimide or acrylic, that can be provided by coating.

The light-emitting element layer 5 includes an anode 22 overlying the planarization film 21, an insulating cover film 23c covering an edge of the anode 22, an EL (electroluminescence) layer 24 overlying the cover film 23c, and a cathode 25 overlying the EL layer 24. The cover film 23c is formed, for example, by patterning an applied organic material such as polyimide or acrylic by photolithography.

A light-emitting element ES (e.g., an OLED (organic light-emitting diode) or a QLED (quantum dot light-emitting diode)), including the insular anode 22, the EL layer 24, and the cathode 25, is formed for each subpixel in the light-emitting element layer 5. A subpixel circuit is formed in the TFT layer 4 to control the light-emitting element ES.

The EL layer 24 includes, for example, a stack of a hole injection layer, a hole transport layer, a light-emitting layer, an electron transport layer, and an electron injection layer that are arranged in this order when viewed from below. The light-emitting layer is formed in an insular shape for each opening in the cover film 23c (for each subpixel) by vapor deposition or inkjet technology. Other layers are provided either in an insular manner or across all the openings (common layer). One or more of the hole injection layer, the hole transport layer, the electron transport layer, and the electron injection layer may be omitted.

A FMM (fine metal mask) is used in forming a light-emitting layer for OLEDs by vapor deposition. An FMM is a sheet of, for example, an invar material with numerous openings. An organic material that passes through an opening forms an insular light-emitting layer (corresponding to one subpixel).

An insular QLED light-emitting layer (corresponding to one subpixel) can be formed, for example, by applying a solvent containing diffused quantum dots by inkjet coating.

The anode 22 includes a stack of, for example, ITO (indium tin oxide) and either Ag (silver) or a Ag-containing alloy, so that the anode 22 is light-reflective. The cathode (cathode) 25 may be formed of a transparent conductive material such as a Mg—Ag alloy (super thin film), ITO, or IZO (indium zinc oxide).

When the light-emitting element ES is an OLED, holes and electrons recombine in the light-emitting layer due to the drive current flowing between the anode 22 and the cathode 25, to produce excitons that fall to the ground state to emit light. Since the cathode 25 is transparent, and the anode 22 is reflective, the light emitted by the EL layer 24 travels upwards, thereby achieving a top-emission display.

When the light-emitting element ES is a QLED, holes and electrons recombine in the light-emitting layer due to the drive current flowing between the anode 22 and the cathode 25, to produce excitons that transition from the conduction band to the valence band of the quantum dot to emit light (fluorescence).

The light-emitting element layer 5 may include light-emitting elements other than the OLEDs and QLEDs, such as inorganic light-emitting diodes.

A sealing layer 6 is transparent and includes a first inorganic insulation film 26 covering the cathode 25, an organic insulation film 27 overlying the first inorganic insulation film 26, and a second inorganic insulation film 28 overlying the organic insulation film 27. The sealing layer 6, covering the light-emitting element layer 5, prevents foreign materials such as water and oxygen from seeping into the light-emitting element layer 5.

The first inorganic insulation film 26 and the second inorganic insulation film 28 may each include, for example, a silicon oxide film, a silicon nitride film, a silicon oxynitride film, or a stack of these films. These films can be formed by CVD. The organic insulation film 27 is a transparent organic film that exhibits a planarization effect. The organic insulation film 27 may be made of an organic material, such as acrylic, that can be provided by coating.

The first bank 23a and the second bank 23b are provided to stop liquid drops in forming the organic insulation film 27, for example, by inkjet coating. In other words, as shown in FIG. 3, the first bank 23a is provided like a frame around the display area DA, and the second bank 23b is provided like a frame around the first bank 23a. Both the first bank 23a and the second bank 23b (in particular, the first bank 23a which is located closer to the display area DA) are in contact with an edge of the organic insulation film 27, to define the edge as shown in FIGS. 1 and 2.

The touch-panel-use lines 32 (see FIG. 3) are provided on the sealing layer 6. Both the first touch-panel-use line 321 and the second touch-panel-use line 322 are one of the touch-panel-use lines 32 and adjacent to each other.

The interlayer insulation film 323 is provided to insulate the first touch-panel-use line 321 from the second touch-panel-use line 322.

The display device 2 further includes a protection layer 8 overlying the touch panel layer TP. The protection layer 8 is a film of, for example, an organic material or a resin.

A comparison of FIGS. 1 and 2 shows that in intersections C1 and C2 where the first touch-panel-use line 321 and the second touch-panel-use line 322 intersect with the first bank 23a and the second bank 23b respectively (see FIGS. 1 and 2), the first touch-panel-use line 321 and the second touch-panel-use line 322 reside with the interlayer insulation film 323 intervening therebetween. In other words, in these intersections, the first touch-panel-use line 321 overlies the second inorganic insulation film 28 and underlies the interlayer insulation film 323, whereas the second touch-panel-use line 322 overlies the interlayer insulation film 323 and underlies the protection layer 8.

The display layer DP further includes routing lines 41 and a connecting section 43. The routing lines 41 reside in the same layer as one of the conductive layers (not shown) in the TFT layer 4. The connecting section 43 electrically connects the routing lines 41 to the touch-panel-use lines 32 outside the first bank 23a, the second bank 23b, and the sealing layer 6 in the non-display area NA. The routing lines 41 may include source lines routed outside the first bank 23a and the second bank 23b in the non-display area NA. The connecting section 43 resides between the display area DA and the terminal section TM. Specifically, the connecting section 43 resides close to a side of the display area DA facing the terminal section TM.

The touch panel layer TP contains therein metal layers including a first metal layer M1 and a second metal layer M2 that are separated from each other by the interlayer insulation film 323 intervening therebetween. The first metal layer M1 overlies the second inorganic insulation film 28 and underlies the interlayer insulation film 323. The second metal layer M2 overlies the interlayer insulation film 323 and underlies the protection layer 8. In other words, the touch panel layer TP includes the first metal layer M1, the interlayer insulation film 323, and the second metal layer M2 arranged in this order when viewed from the display layer DP. The first metal layer M1 and the second metal layer M2 are preferably made of the same material, but may be made of different materials.

FIG. 2 shows that the second touch-panel-use line 322 includes a joint MM by which the first metal layer M1 and the second metal layer M2, separated from each other by the interlayer insulation film 323 intervening therebetween, are connected to each other (1) between the display area DA and the first bank 23a and between the display area DA and the second bank 23b in the non-display area NA and also (2) between an edge of the display device 2 and the side of the display area DA facing the terminal section TM in the non-display area NA. The opposite side of the joint MM from the first bank 23a and the second bank 23b is a part of the first metal layer M1, whereas the same side of the joint MM as the first bank 23a and the second bank 23b is a part of the second metal layer M2. FIG. 1 meanwhile shows that the first touch-panel-use line 321 includes no joint corresponding to the joint MM and is a part of the first metal layer M1 as are the sensing sections 30.

The second touch-panel-use line 322 may alternatively be structured such that the first metal layer M1 and the second metal layer M2, separated from each other by the interlayer insulation film 323 intervening therebetween, are connected to each other (1) between the display area DA and the first bank 23a and between the display area DA and the second bank 23b in the non-display area NA and also (2) between an edge of the display device 2 and a side of the display area DA not facing the terminal section TM in the non-display area NA. For instance, the joint MM may be provided close to a side of the display area DA not facing the terminal section TM.

Each touch-panel-use line 32 may include a single layer of any one of metals of titanium, molybdenum, copper, aluminum, and tungsten and may include a stack of layers containing at least one of these metals. For instance, the touch-panel-use line 32 preferably includes a stack of titanium/aluminum/titanium layers. Alternatively, the touch-panel-use line 32 may be made of the same material as the source lines and may be made of the same material as the touch panel (e.g., ITO or IZO).

The sensing sections 30 transfer measurements from the touch panel layer TP.

Figure 4:
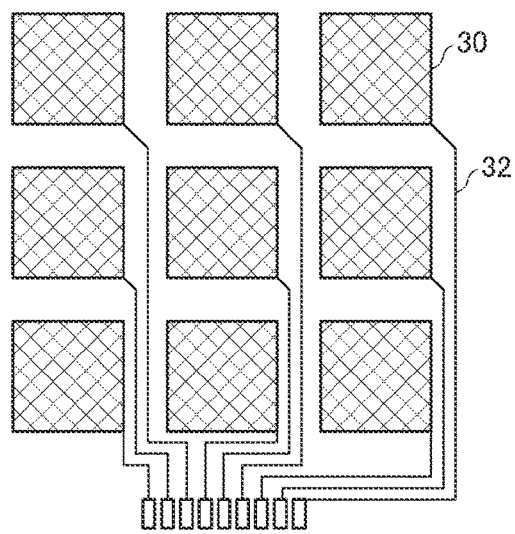
FIG. 4 is a schematic plan view of wiring in a touch panel layer in accordance with Embodiment 1 of the disclosure.

FIG. 4 is a schematic plan view of wiring in the touch panel layer TP in accordance with Embodiment 1 of the disclosure. The touch panel layer TP includes a plurality of sensing sections 30 (3×3=9 sensing sections 30 in FIG. 4). Each sensing section 30 includes a mesh or lattice of wires and may alternatively include electrode pads. Each sensing section 30 is connected to a different one of the touch-panel-use lines 32. The wiring in the touch panel layer TP shown in FIG. 4 is of a "self-capacitance" type, and the sensing sections 30 reside in the same layer. Referring to FIGS. 1 and 2, the sensing sections 30 reside in the first metal layer M1 as does the first touch-panel-use line 321.

The description given so far is still applicable when the first touch-panel-use line 321 and the second touch-panel-use line 322 are transposed and also when the first metal layer M1 and the second metal layer M2 are transposed.

Discussion of Effects of Embodiment 1 in View of Comparative Example

A description will be given of a display device 52 (comparative example) in which the first touch-panel-use line 321 and the second touch-panel-use line 322 reside in the same layer in the intersections thereof with the first bank 23a and the second bank 23b. Because the concept of providing the joint MM is missing in the display device 52, both the first touch-panel-use line 321 and the second touch-panel-use line 322 are a part of the first metal layer M1 in the intersections. It follows that there is provided no interlayer insulation film 323 in the display device 52. The display device 52 has otherwise the same structure as the display device 2.

Portions (a) and (b) of FIG. 5 are partial cross-sectional views showing manufacturing steps for the display device 52 in accordance with the comparative example, illustrating problems of the display device 52. For convenience of description, the members 103, 108, . . . in FIG. 5 are counterparts or equivalents of the members 3, 8, . . . in FIG. 1 and/or FIG. 2 respectively.

As shown in (a) and (b) of FIG. 5, the display device 52 includes a plurality of touch-panel-use lines 132 that is typically formed by providing a film of a conductive material so as to cover an entire surface of the sealing layer that is an equivalent of the sealing layer 6 and etching the film of a conductive material. This method is likely to leave residues of the conductive material around the touch-panel-use lines 132, particularly in intersections of the touch-panel-use lines 132 with a first bank 123a and a second bank 123b, and more specifically, proximate to locations where the touch-panel-use lines 132 follow a bent line or a similarly curved line because of the elevated height of the first bank 123a and the second bank 123b. Examples of such locations where residues are likely to be left include regions 92a to 92d shown in (b) of FIG. 5. The display device 52 has a problem that the residues electrically may connect two adjacent touch-panel-use lines 132, thereby short-circuiting these two touch-panel-use lines 132. The short-circuiting may be prevented by providing a planarization layer (not shown) on the sealing layer and providing a touch panel layer per se on the planarization layer. This structure however works directly against efforts for a thin display device.

In contrast, in the display device 2, the interlayer insulation film 323 resides between the first touch-panel-use line 321 and the second touch-panel-use line 322 in the intersections of the first touch-panel-use line 321 and the second touch-panel-use line 322 with the first bank 23a and the second bank 23b in the non-display area NA. The display device 2 therefore lowers the risk of the first touch-panel-use line 321 and the second touch-panel-use line 322 being short-circuited in the intersections. The display device 2 is hence capable of preventing adjacent touch-panel-use lines 32 from being short-circuited even when the touch panel has an on-cell structure as an attempt for a thin display device.

Embodiment 2

FIG. 6 is a partial cross-sectional view of a display device 102 in accordance with Embodiment 2 of the disclosure, primarily showing a first touch-panel-use line 321. FIG. 7 is a partial cross-sectional view of the display device 102 in accordance with Embodiment 2 of the disclosure, primarily showing a second touch-panel-use line 322.

A description is now given of differences between the display device 2 and the display device 102.

FIG. 6 shows that the first touch-panel-use line 321 includes a joint MM1 by which the first metal layer M1 and the second metal layer M2, separated from each other by the interlayer insulation film 323 intervening therebetween, are connected to each other (1) between the display area DA and the first bank 23a and between the display area DA and the second bank 23b in the non-display area NA and also (2) between an edge of the display device 2 and a side of the display area DA facing the terminal section TM in the non-display area NA. The opposite side of the joint MM1 from the first bank 23a and the second bank 23b is a part of the second metal layer M2, whereas the same side of the joint MM1 as the first bank 23a and the second bank 23b is a part of the first metal layer M1.

FIG. 7 shows that the second touch-panel-use line 322 includes a joint MM2 by which the first metal layer M1 and the second metal layer M2, separated from each other by the interlayer insulation film 323 intervening therebetween, are connected to each other (1) between the display area DA and the first bank 23a and between the display area DA and the second bank 23b in the non-display area NA and also (2) between an edge of the display device 2 and the side of the display area DA facing the terminal section TM in the non-display area NA. The opposite side of the joint MM2 from the first bank 23a and the second bank 23b is a part of the first metal layer M1, whereas the same side of the joint MM2 as the first bank 23a and the second bank 23b is a part of the second metal layer M2.

FIG. 8 is a schematic plan view of wiring in a touch panel layer in accordance with Embodiment 2 of the disclosure. The touch panel layer includes a plurality of first sensing sections 30a (2×2=4 first sensing sections 30a in FIG. 7) and a plurality of second sensing sections 30b (3×3=9 second sensing sections 30b in FIG. 7), as a plurality of sensing sections 30. Each first sensing section 30a and each second sensing section 30b include a mesh of wires and may alternatively include electrode pads. Each column of the first sensing sections 30a is connected to a different one of the touch-panel-use lines 32. Each line of the second sensing sections 30b is connected to a different one of the touch-panel-use lines 32. The wiring in the touch panel layer shown in FIG. 8 is of a "mutual-capacitance" type. The first sensing section 30a and the second sensing section 30b have different functions. As an example, when either the first sensing section 30a or the second sensing section 30b has a drive electrode (corresponding to a drive line), the other sensing section 30a or 30b is a detection electrode (corresponding to a sensing line). The first sensing section 30a and the second sensing section 30b may be a part of the same layer (either the first metal layer M1 or the second metal layer M2) and may be parts of different layers (the first metal layer M1 and the second metal layer M2). A touch-panel-use line 32a intersects with a touch-panel-use line 32b in an intersection CS. Either the touch-panel-use line 32a or the touch-panel-use line 32b is a part of the first metal layer M1, and the other touch-panel-use line 32a or 32b is a part of the second metal layer M2, in the intersection CS.

The structures of the first sensing sections 30a and the second sensing sections 30b shown in FIG. 8 are mere examples. In other words, the first sensing sections 30a and the second sensing sections 30b do not necessarily include a mesh of wires and may be provided as a single continuous film. When the first sensing section 30a and the second sensing section 30b are wires including, for example, a stack of titanium/aluminum/titanium layers, the first sensing section 30a and the second sensing section 30b preferably include a mesh of wires because the first sensing section 30a and the second sensing section 30b are not transparent and may block light. In contrast, when the first sensing section 30a and the second sensing section 30b are, for example, ITO wires, the first sensing section 30a and the second sensing section 30b may include a mesh of wires and may be provided as a single continuous film, because the first sensing section 30a and the second sensing section 30b are transparent.

The description given so far is still applicable when the first touch-panel-use line 321 and the second touch-panel-use line 322 are transposed and also when the first metal layer M1 and the second metal layer M2 are transposed.

FIG. 9 is a partial cross-sectional view of a display device 202 in accordance with a variation example of Embodiment 2 of the disclosure, primarily showing the first touch-panel-use line 321. FIG. 10 is a partial cross-sectional view of the display device 202 in accordance with the variation example of Embodiment 2 of the disclosure, primarily showing the second touch-panel-use line 322.

A description is now given of differences between the display device 102 and the display device 202.

FIGS. 9 and 10 show that neither the first touch-panel-use line 321 nor the second touch-panel-use line 322 includes a joint that is equivalent of the joint MM1 or MM2. The first touch-panel-use line 321 is a part of the first metal layer M1, and the second touch-panel-use line 322 is a part of the second metal layer M2.

FIG. 8 shows that when the first sensing sections 30a and the second sensing sections 30b reside in different metal layers, it is possible to provide the interlayer insulation film 323 intervening between the first touch-panel-use line 321 and the second touch-panel-use line 322 in the intersections thereof with the first bank 23a and the second bank 23b even if there is provided no joint as shown in FIGS. 9 and 10.

Additional Remarks

The display device in each embodiment may be used as a flexible display device. This flexible display device is not limited in any particular manner as long as the flexible display device is a display panel including flexible, bendable display elements. As described earlier, light-emitting elements ES are classified into those display elements whose luminance and transmittance are controlled through electric current and those display elements whose luminance and transmittance are controlled through voltage. Examples of current-controlled display elements include OLED (organic light-emitting diode) display devices including OLEDs, EL display devices such as inorganic EL display devices including inorganic light-emitting diodes, and QLED (quantum dot light-emitting diodes) display devices including QLEDs. Examples of voltage-controlled display elements include liquid crystal display elements.

General Description

The disclosure, in aspect 1 thereof, relates to a display device having: a display area; a non-display area around the display area; and a terminal section in the non-display area, the display device including: a display layer including: a TFT layer; a light-emitting element layer controlled by the TFT layer; a sealing layer on the light-emitting element layer, the sealing layer including a first inorganic insulation film, an organic insulation film, and a second inorganic insulation film that are arranged in this order when viewed from the light-emitting element layer; and a bank around the display area, the bank defining an edge of the organic insulation film; and a touch panel layer, wherein the touch panel layer includes a plurality of touch-panel-use lines electrically connecting the terminal section to a plurality of sensing sections configured to transfer measurements, the plurality of touch-panel-use lines resides on the sealing layer so as to intersect with the bank in a plan view of the display device, and the plurality of touch-panel-use lines includes a first touch-panel-use line and a second touch-panel-use line that are adjacent to each other, an interlayer insulation film being interposed between the first touch-panel-use line and the second touch-panel-use line in an intersection where the first touch-panel-use line and the second touch-panel-use line intersect with the bank.

In this structure, the interlayer insulation film is interposed between the first touch-panel-use line and the second touch-panel-use line in a intersection where the first touch-panel-use line and the second touch-panel-use line intersect with the bank in the non-display area. The structure therefore lowers the risk of the first touch-panel-use line and the second touch-panel-use line being short-circuited in the intersection. The structure is hence capable of preventing adjacent touch-panel-use lines from being short-circuited even when the touch panel has an on-cell structure as an attempt for a thin display device.

In aspect 2 of the disclosure, the display device of aspect 1 is configured such that the display layer includes: a routing line in a layer where the TFT layer resides; and a connecting section electrically connecting the plurality of touch-panel-use lines to the routing line outside the bank and the sealing layer in the non-display area.

In aspect 3 of the disclosure, the display device of aspect 2 is configured such that the connecting section resides between the display area and the terminal section.

In aspect 4 of the disclosure, the display device of any one of aspects 1 to 3 is configured such that either the first touch-panel-use line or the second touch-panel-use line includes a joint between the display area and the bank in the non-display area, the joint connecting a first metal layer and a second metal layer that are separated by the interlayer insulation film, is a part of a layer in which another one of the first touch-panel-use line and the second touch-panel-use line resides, on an opposite side of the joint from the bank out of the first metal layer and the second metal layer, and is a part of a layer other than the layer in which the other one of the first touch-panel-use line and the second touch-panel-use line resides, on a bank side of the joint out of the first metal layer and the second metal layer.

In aspect 5 of the disclosure, the display device of aspect 4 is configured such that the joint resides between an edge of the display device and a side of the display area not facing the terminal section.

In aspect 6 of the disclosure, the display device of aspect 4 is configured such that the joint resides between an edge of the display device and a side of the display area facing the terminal section.

In aspect 7 of the disclosure, the display device of any one of aspects 1 to 6 is configured such that the touch panel layer includes a first metal layer and the interlayer insulation film that are arranged in this order when viewed from the display layer, the plurality of sensing sections and the first touch-panel-use line are parts of the first metal layer, and the second touch-panel-use line is a part of a metal layer other than the first metal layer in the intersection.

In aspect 8 of the disclosure, the display device of any one of aspects 1 to 6 is configured such that the touch panel layer includes a first metal layer, the interlayer insulation film, and a second metal layer that are arranged in this order when viewed from the display layer, the plurality of sensing sections includes a first sensing section and a second sensing section each of which is a part of either the first metal layer or the second metal layer and that have different functions, the first touch-panel-use line is a part of one of the first metal layer and the second metal layer in the intersection, and the second touch-panel-use line is a part of another one of the first metal layer and the second metal layer in the intersection.

In aspect 9 of the disclosure, the display device of aspect 8 is configured such that the first metal layer and the second metal layer are made of a same material.

In aspect 10 of the disclosure, the display device of any one of aspects 1 to 9 is configured such that the plurality of sensing sections includes a mesh of wires.

In aspect 11 of the disclosure, the display device of any one of aspects 1 to 10 is configured such that the plurality of touch-panel-use lines includes a single layer of any one of titanium, molybdenum, copper, aluminum, and tungsten or a stack of layers containing at least one of these materials.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A display device having: a display area; a non-display area around the display area; and a terminal section in the non-display area, the display device comprising:
a display layer including:
a TFT layer;
a light-emitting element layer controlled by the TFT layer;
a sealing layer on the light-emitting element layer, the sealing layer including a first inorganic insulation film, an organic insulation film, and a second inorganic insulation film that are arranged in this order when viewed from the light-emitting element layer; and
a bank around the display area, the bank defining an edge of the organic insulation film; and
a touch panel layer, wherein
the touch panel layer includes a plurality of touch-panel-use lines electrically connecting the terminal section to a plurality of sensing sections configured to transfer measurements,
the plurality of touch-panel-use lines resides on the sealing layer so as to intersect with the bank in a plan view of the display device, and
the plurality of touch-panel-use lines comprises a first touch-panel-use line and a second touch-panel-use line that are adjacent to each other, an interlayer insulation film being interposed between the first touch-panel-use line and the second touch-panel-use line in an intersection where the first touch-panel-use line and the second touch-panel-use line intersect with the bank, wherein either the first touch-panel-use line or the second touch-panel-use line
includes a joint between the display area and the bank in the non-display area, the joint connecting a first metal layer and a second metal layer that are separated by the interlayer insulation film,
is a part of a layer in which another one of the first touch-panel-use line and the second touch-panel-use line resides, on an opposite side of the joint from the bank out of the first metal layer and the second metal layer, and
is a part of a layer other than the layer in which the other one of the first touch-panel-use line and the second touch-panel-use line resides, on a bank side of the joint out of the first metal layer and the second metal layer.

2. The display device according to claim 1, wherein the display layer includes: a routing line in a layer where the TFT layer resides; and a connecting section electrically connecting the plurality of touch-panel-use lines to the routing line outside the bank and the sealing layer in the non-display area.

3. The display device according to claim 2, wherein the connecting section resides between the display area and the terminal section.

4. The display device according to claim 1, wherein the joint resides between an edge of the display device and a side of the display area not facing the terminal section.

5. The display device according to claim 1, wherein the joint resides between an edge of the display device and a side of the display area facing the terminal section.

6. The display device according to claim 1, wherein
the touch panel layer includes the first metal layer, the interlayer insulation film, and the second metal layer that are arranged in this order when viewed from the display layer,
the plurality of sensing sections and the first touch-panel-use line are parts of the first metal layer, and
the second touch-panel-use line is a part of the second metal layer other than the first metal layer in the intersection.

7. A display device having: a display area; a non-display area around the display area; and a terminal section in the non-display area, the display device comprising:
a display layer including:
a TFT layer;
a light-emitting element layer controlled by the TFT layer;
a sealing layer on the light-emitting element layer, the sealing layer including a first inorganic insulation film, an organic insulation film, and a second inorganic insulation film that are arranged in this order when viewed from the light-emitting element layer; and
a bank around the display area, the bank defining an edge of the organic insulation film; and
a touch panel layer, wherein
the touch panel layer includes a plurality of touch-panel-use lines electrically connecting the terminal section to a plurality of sensing sections configured to transfer measurements,
the plurality of touch-panel-use lines resides on the sealing layer so as to intersect with the bank in a plan view of the display device, and
the plurality of touch-panel-use lines comprises a first touch-panel-use line and a second touch-panel-use line that are adjacent to each other, an interlayer insulation film being interposed between the first touch-panel-use line and the second touch-panel-use line in an intersection where the first touch-panel-use line and the second touch-panel-use line intersect with the bank, wherein the touch panel layer includes a first metal layer, the interlayer insulation film, and a second metal layer that are arranged in this order when viewed from the display layer, the plurality of sensing sections includes a first sensing section and a second sensing section each of which is a part of either the first metal layer or the second metal layer and that have different functions, the first touch-panel-use line is a part of one of the first metal layer and the second metal layer in the intersection, and the second touch-panel-use line is a part of another one of the first metal layer and the second metal layer in the intersection.

8. The display device according to claim 7, wherein the first metal layer and the second metal layer are made of a same material.

9. The display device according to claim 1, wherein the plurality of sensing sections includes a mesh of wires.

10. The display device according to claim 1, wherein the plurality of touch-panel-use lines includes a single layer of any one of titanium, molybdenum, copper, aluminum, and tungsten or a stack of layers containing at least one of these materials.

* * * * *